(12) United States Patent
Polavarapu et al.

(10) Patent No.: US 9,027,226 B2
(45) Date of Patent: May 12, 2015

(54) METHOD FOR IMPLEMENTING PROMPT DOSE MITIGATING CAPACITOR

(71) Applicant: BAE Systems Information and Electronic Systems Integration Inc., Nashua, NH (US)

(72) Inventors: Murty S. Polavarapu, Vienna, VA (US); Nadim F. Haddad, Oakton, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 195 days.

(21) Appl. No.: 13/851,804

(22) Filed: Mar. 27, 2013

(65) Prior Publication Data

US 2014/0290038 A1   Oct. 2, 2014

(51) Int. Cl.
| | |
|---|---|
| H01S 4/00 | (2006.01) |
| H01R 43/00 | (2006.01) |
| H05K 3/30 | (2006.01) |
| H01L 21/00 | (2006.01) |
| H01G 2/06 | (2006.01) |
| H01L 23/00 | (2006.01) |
| H01G 4/33 | (2006.01) |

(52) U.S. Cl.
CPC ........... *H01G 2/065* (2013.01); *Y10T 29/49002* (2015.01); *H01G 4/33* (2013.01); *H01L 24/01* (2013.01)

(58) Field of Classification Search
CPC ................. H01G 7/023; H01L 2924/01079; H01L 2224/16; H01L 2924/14; H01L 2924/01078; H02G 1/1256
USPC ......... 29/592.1, 825, 832; 257/778, 786, 737; 438/108, 106
See application file for complete search history.

(56) References Cited

U.S. PATENT DOCUMENTS

| | | | | |
|---|---|---|---|---|
| 5,719,449 | A * | 2/1998 | Strauss ......................... | 257/786 |
| 6,323,559 | B1 * | 11/2001 | Chan et al. .................... | 257/778 |
| 6,933,613 | B2 * | 8/2005 | Akashi ......................... | 257/778 |
| 7,616,167 | B2 * | 11/2009 | Anzai ........................... | 343/787 |
| 7,638,867 | B2 * | 12/2009 | Xu et al. ....................... | 257/686 |
| 7,667,299 | B2 * | 2/2010 | Mori et al. .................... | 257/623 |
| 7,808,117 | B2 * | 10/2010 | Vo et al. ........................ | 257/786 |
| 7,816,183 | B2 * | 10/2010 | Kawata ......................... | 438/109 |
| 8,115,304 | B1 * | 2/2012 | Joshi et al. .................... | 257/724 |
| 8,253,232 | B2 * | 8/2012 | Kim et al. ..................... | 257/686 |
| 8,283,779 | B2 * | 10/2012 | Fujii .............................. | 257/737 |
| 8,350,382 | B2 * | 1/2013 | Furgut et al. .................. | 257/724 |
| 2008/0316723 | A1 * | 12/2008 | Borland et al. ............... | 361/763 |

\* cited by examiner

*Primary Examiner* — David Angwin
(74) *Attorney, Agent, or Firm* — Russell Ng PLLC; Anthony Ng

(57) ABSTRACT

A method for implementing a prompt dose mitigating capacitor is disclosed. Initially, a flip chip is provided with multiple capacitors. The flip chip is then placed on top of a substrate having multiple electronic devices connected to a set of power rails. The terminals of the capacitors within the flip chip are subsequently connected to the power rails within the substrate in order to regulate voltages appeared on the power rails during a radiation pulse.

4 Claims, 1 Drawing Sheet

METHOD FOR IMPLEMENTING PROMPT DOSE MITIGATING CAPACITOR

STATEMENT OF GOVERNMENT INTEREST

The present invention was made with United States Government support under contract number DTRA01-03-D-0007-0001 awarded by the Defense Threat Reduction Agency. The United States Government has certain rights in the present invention.

BACKGROUND OF THE INVENTION

1. Technical Field

The present invention relates to integrated circuits in general, and in particular to a method for fabricating radiation-tolerant integrated circuit devices.

2. Description of Related Art

Most of today's high-density integrated circuit (IC) devices have been fabricated with complementary-metal-oxide semiconductor (CMOS) processing technology that is well-known to those skilled in the art of semiconductor processing. Two biggest advantages of CMOS IC devices are high noise immunity and low power dissipation. As such, CMOS IC devices are desirable in most commercial applications. However, standard CMOS IC devices may not be very suitable for aerospace applications because those environments tend to be characterized by high levels of radiation, particularly charged particles, and standard CMOS IC devices are notorious for having a relatively low radiation tolerance.

Prompt dose upset (PDU) and prompt dose transients (PDT) are terms used to describe a response of an electronic circuit to a radiation pulse. A radiation pulse generates multiple electron-hole pairs in the semiconductor material through an ionization process. The electrons are swept toward, and collected at the positive circuit nodes, creating a negative pulse. In conjunction, the holes are collected in the ground terminal(s). Because an electronic circuit has inherent impedance, the above-mentioned "photo-current" creates undesired voltage drops, resulting in a "rail-span collapse," i.e., a collapse of voltage across the circuit nodes, which in turn cause logical or storage errors. The collapse of power rails in input/output (I/O) circuits create temporary transients, resulting in signal changes at the output of the I/O circuits. The effect of the radiation pulse worsens as power supply voltage is reduced with advance technologies (thus reducing the overhead margin), and with increase in device size and complexity (which increases the amount of photo-current).

SUMMARY OF THE INVENTION

In accordance with a preferred embodiment of the present invention, a flip chip is provided with multiple capacitors. The flip chip is then placed on top of a substrate having multiple electronic devices connected to a set of power rails. The terminals of the capacitors within the flip chip are subsequently connected to the power rails within the substrate in order to regulate voltages appeared on the power rails during a radiation pulse.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

In order to mitigate the photo-current effect, high-speed switching capacitors are commonly used on circuit boards, or even in electronic packages, to supply the required charge and regulate the supply voltage during a radiation pulse. However, some of the effectiveness of this regulation is lost due to the impedance of the path between capacitors and semiconductor devices.

The above-mentioned deficiency can be addressed by placing prompt dose mitigating capacitors directly on a semiconductor device in order to reduce the impedance of the path to the circuit. One method to implement prompt dose mitigating capacitors is to use a separate metal-insulator-metal capacitor (MIMCAP) flip-chip that can be mounted on top of a semiconductor device.

Figure 1:
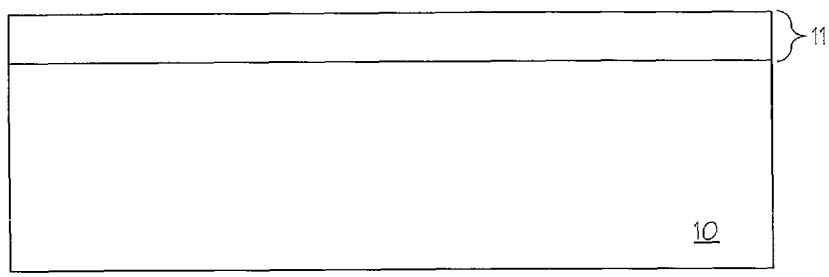
FIGS. 1-2 are diagrams illustrating a method for implementing prompt dose mitigating capacitors.
Figure 2:
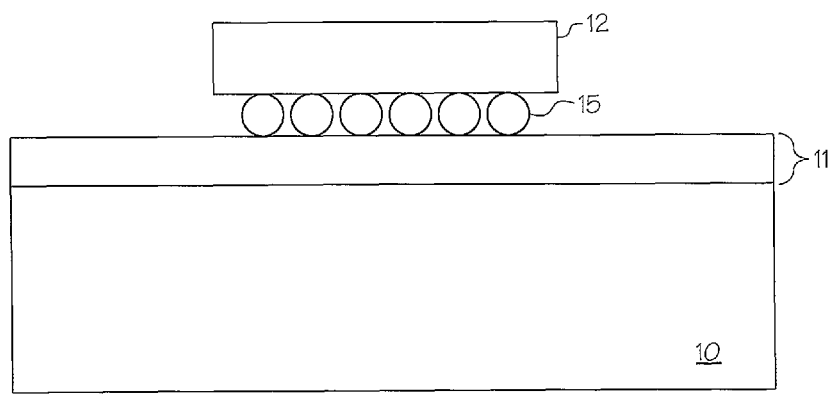

Referring now to the drawings and in particular to FIGS. 1-2, there are illustrated a method for implementing prompt dose mitigating capacitors, in accordance with a preferred embodiment of the present invention. Initially, electrical devices 11 are fabricated on a substrate 10, preferably via a complementary-metal oxides semiconductor (CMOS) process that is well-known to those skilled in the art, as shown in FIG. 1. Substrate 10 is preferably made of silicon. Electrical devices 11 within substrate 10 are connected to various power rails such as Vdd1, Vdd2 and Vdd3 within substrate 10, and ground rails such as GND1 and GND2 within substrate 10.

A flip-chip 12 is then placed on top of substrate 10 via a ball grid array 15, as depicted in FIG. 2. Flip-chip 12 includes multiple capacitors such as MIMCAP. Alternatively, flip-chip 12 may include multiple deep trench capacitors. Positive terminals of the capacitors within flip-chip 12 are connected to the corresponding power rails (not shown) within substrate 11. For example, the positive terminals of the capacitors can be connected to various power rails such as Vdd1, Vdd2 or Vdd3. Similarly, negative terminals of the capacitors within flip-chip 12 are connected to the corresponding ground rails (not shown) within substrate 11. For example, the negative terminals of the capacitors can be connected various ground rails such as GND1 or GND2. The capacitors within flip-chip 12 should be placed as close to electrical device 11 as possible in order to maximize their voltage regulation effectiveness.

The required capacitance of the capacitors within flip-chip 12 needs to be significantly large in order to store enough charge to counteract the effect of radiation induced photo-current.

A typical radiation pulse of $1 \times 10^9$ (Si)/s magnitude generated several amperes of current in a semiconductor device (approximately 1-10 A). A typical radiation pulse from a flash X-ray source lasts about 20 ns, thus creating 20-200 nC of charge. A typical operating voltage is approximately 1 V and needs to be regulated to ±0.1 V during the radiation pulse in order to operate error free through the event. This necessitates a capacitance of 0.2-2 µF. If MIMCAPs are being used within flip-chip 12, and each of the MIMCAPs has a characteristic capacitance of around 10 fF/µm$^2$, the total area of the MIMCAP needs to be about 20-200 mm$^2$.

As has been described, the present invention provides a method for implementing prompt dose mitigating capacitors.

While the invention has been particularly shown and described with reference to a preferred embodiment, it will be understood by those skilled in the art that various changes in form and detail may be made therein without departing from the spirit and scope of the invention.

What is claimed is:

1. A method for mitigating prompt dose upset and prompt dose transients, said method comprising:
   providing a flip chip having a plurality of capacitors;
   placing said flip chip on top of an electronic device's substrate on which a plurality of electronic components were built, wherein said plurality of electronic components are connected to a set of power rails within said substrate of said electronic device; and
   connecting terminals of said plurality of capacitors within said flip chip only to said power rails within said substrate of said electronic device to form a prompt dose mitigating capacitor configured to supply an amount of charges in order to regulate voltages on said power rails within said substrate of said electronic device after an occurrence of a radiation pulse.

2. The method claim 1, wherein said connecting further includes connecting terminals of said plurality of capacitors within said flip chip only to said power rails within said substrate via a ball grid array.

3. The method of claim 1, wherein said capacitors are MIMCAPs.

4. The method of claim 1, wherein said capacitors are trench capacitors.

* * * * *